United States Patent
Ohdaira et al.

(10) Patent No.: US 7,132,171 B2
(45) Date of Patent: Nov. 7, 2006

(54) LOW DIELECTRIC CONSTANT INSULATING FILM AND METHOD OF FORMING THE SAME

(75) Inventors: Toshiyuki Ohdaira, Ibaraki (JP); Yoshimi Shioya, Chiba (JP)

(73) Assignees: National Institute of Advanced Industrial Science and Technology, Tokyo (JP); Semiconductor Process Laboratory Co., Ltd., Ichikawa (JP)

( * ) Notice: Subject to any disclaimer, the term of this patent is extended or adjusted under 35 U.S.C. 154(b) by 64 days.

(21) Appl. No.: 10/847,670

(22) Filed: May 18, 2004

(65) Prior Publication Data
US 2005/0003213 A1 Jan. 6, 2005

(30) Foreign Application Priority Data
May 30, 2003 (JP) ............................. 2003-154429

(51) Int. Cl.
*B32B 25/20* (2006.01)

(52) U.S. Cl. ..................................... 428/447; 427/155.2

(58) Field of Classification Search ................ 428/447; 427/155.2
See application file for complete search history.

(56) References Cited

U.S. PATENT DOCUMENTS 6,420,441 B1 * 7/2002 Allen et al. .................... 521/77
2002/0182845 A1 12/2002 Miyano et al.
2003/0024103 A1 * 2/2003 Kiguchi et al. ............... 29/601

FOREIGN PATENT DOCUMENTS

JP 2000-273176 10/2000
JP 2002-359241 12/2002

* cited by examiner

*Primary Examiner*—Kuo-Liang Peng
(74) *Attorney, Agent, or Firm*—Bacon & Thomas, PLLC (57) ABSTRACT

The present invention relates to a method of forming a low dielectric constant insulating film. Its constitution has the steps of: (a) forming an insulating film containing Si—$CH_3$ bond in the skeleton of Si—O—Si on a substrate; (b) irradiating ultraviolet ray to the insulating film in reduced-pressure atmosphere to break $CH_3$ groups from Si—$CH_3$ bond in the insulating film; and (c) ejecting the broken $CH_3$ groups from the insulating film.

13 Claims, 4 Drawing Sheets

LOW DIELECTRIC CONSTANT INSULATING FILM AND METHOD OF FORMING THE SAME

BACKGROUND OF THE INVENTION

1. Field of the Invention

The present invention relates to a low dielectric constant insulating film and a method of forming the same.

2. Description of the Prior Art

In recent years, an insulating film having a low dielectric constant (hereinafter, referred to as a low dielectric constant insulating film) is used in a semiconductor integrated circuit in order to suppress the delay of signals communicating in wirings and to improve the processing speed of the entire circuit.

Although a semiconductor roadmap requires an interlayer insulating film having a relative dielectric constant of 2.5 or less in and after a generation when a design rule becomes. 65 nm, it has turned out after studying various insulating materials that it is difficult to realize the relative dielectric constant of 2.5 or less with raw (non-porous) material. For this reason, there has been used a way such as reducing the effective dielectric constant of the entire insulating film by reducing a film density while employing an insulating material having the relative dielectric constant of 2.5 or more. It is a method such that pores of nanometers to sub-nanometers are introduced in a formed insulating film to make it porous and thus reduce a film density.

For example, Patent Document 1 describes an example to make it porous by introducing dopant into the formed film and then removing it from the film by oxidation or the like.

[Patent Document 1]

Japanese Patent Laid-open 2000-273176 publication

However, when the pores are introduced in the insulating film to make it porous, there occurs a problem such that mechanical strength of the entire film is reduced significantly and thus the film cannot withstand a polishing process (CMP: chemical mechanical polishing) performed for planarization in process after deposition. To solve the problem, a pore size is made smaller or the porosity is reduced. With this, although the mechanical strength of the film is improved, a low relative dielectric constant so as to be required is not obtained.

SUMMARY OF THE INVENTION

The object of the present invention is to provide a low dielectric constant insulating film and method of forming the same capable of forming an insulating film, which has high film strength adapted for existing conventional semiconductor manufacturing process and a lower relative dielectric constant.

According to the present invention, first, an existing film-forming method such as a plasma-enhanced chemical vapor deposition method and a spin coating method is used to form on a substrate an insulating film that is non-porous or porous such as being as small as a few nanometers or less in pore size, and has Si—CH$_3$ bond with respect to the skeleton of Si—O—Si which has sufficient mechanical strength. Alternatively, it's method is used to form an insulating film that is non-porous or porous and as small as a few nanometers or less in pore size, and has Si—CH$_3$ bond with respect to the silica skeleton of Si—O other than Si—O—Si, and the insulating film whose mechanical strength can be improved by ultraviolet irradiation in reduced-pressure atmosphere after the film formation.

Subsequently, CH$_3$ groups are broken from Si—CH$_3$ bond in the insulating film by the ultraviolet irradiation in the reduced-pressure atmosphere or in the reduced-pressure atmosphere mainly containing inert gas and nitrogen, and then the broken CH$_3$ groups are ejected from the insulating film. For example, it is possible to facilitate ejecting of the broken CH$_3$ groups by simultaneously heating the substrate during the ultraviolet irradiation. Thus, in the case of the non-porous insulating film, the film is made porous, or in the case of the porous insulating film, small pores in the film are made larger.

In this case, the energy of ultraviolet to be irradiated is set higher than the binding energy of Si—CH$_3$ bond groups and lower than the binding energy of Si—O—Si or Si—O other than Si—O—Si, which forms the skeleton. For example, by setting the wavelength of ultraviolet to 120 nm (equivalent to 10 eV of energy) or more, the CH$_3$ groups can be broken from Si—CH$_3$ bond in the insulating film without affecting the skeleton of Si—O—Si or the like. In other words, it is important in the present invention to form an insulating film originally being solid in a skeleton or an insulating film that can be transformed into an insulating film being solid in a skeleton by ultraviolet irradiation in the reduced-pressure atmosphere in order to improve the film strength. Particularly, when using an organic compound having Si—CH$_3$ bond and siloxane bond as a deposition material, the film strength depends on Si—O—Si bond that serves as a skeleton, and it is preferable in comparison to other skeletons. Alternatively, when using another organic compound having Si—CH$_3$ bond, it is transformed into the insulating film being solid in a skeleton by ultraviolet irradiation in the reduced-pressure atmosphere, and thus it is preferable.

According to the present invention, an initial film formation is performed for the insulating film being originally solid in a skeleton of Si—O—Si, or for the insulating film, which has the silica skeleton other than Si—O—Si and can be transformed into the insulating film being solid in a skeleton by ultraviolet irradiation in the reduced-pressure atmosphere. Then by irradiating ultraviolet onto the insulating film in the reduced-pressure atmosphere instead of oxidation, CH$_n$ groups, which are organic groups, are eliminated and ejected from the insulating film without affecting the skeleton. Therefore, it is possible to improve the strength of the insulating film and allow the insulating film to have a lower dielectric constant.

DESCRIPTION OF THE PREFERRED EMBODIMENTS

Embodiments of the present invention will be explained with reference to the drawings hereinafter.

(Explanation of the Ultraviolet Processing Apparatus Used in the Method of Forming the Low Dielectric Constant Insulating Film, Which is the Embodiment of the Present Invention)

Figure 1:
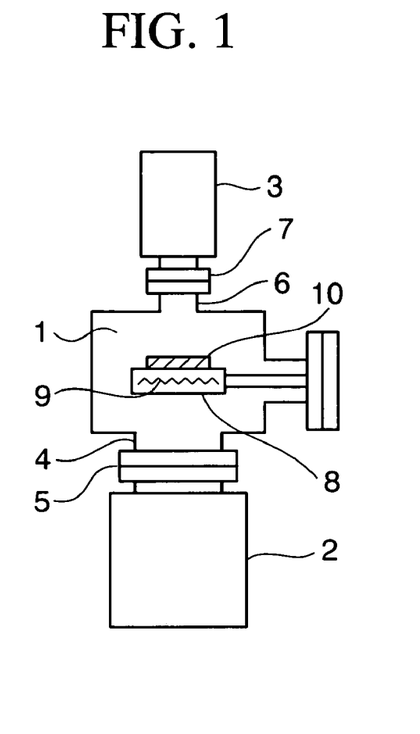
FIG. 1 is a side view showing the constitution of an ultraviolet irradiation processing apparatus used in the method of forming the low dielectric constant insulating film, which is an embodiment of the present invention.

FIG. 1 is the side view showing the constitution of the ultraviolet processing apparatus used in the method of forming the low dielectric constant insulating film according to the embodiment of the present invention.

The ultraviolet processing apparatus comprises a chamber 1 capable of being reduced in pressure, and the chamber 1 is connected to a vacuum-pumping unit 2 through an exhaust pipe 4, as shown in FIG. 1. An open/close valve 5 that controls evacuation/no-evacuation of the chamber 1 is provided halfway the exhaust pipe 4.

A substrate-holding stage 8 is provided in the chamber 1, and the substrate-holding stage 8 is provided with a heater 9 that heats a substrate 10 on the substrate-holding stage 8.

Further, an ultraviolet light source 3 is provided above the substrate-holding stage 8 of the chamber 1 via an ultraviolet ray transmission path 6. A shutter 7 that controls open/close of the path of ultraviolet ray is provided halfway the ultraviolet ray transmission path 6.

A deuterium lamp, a low-pressure mercury lamp, a xenon lamp or the like can be used as the ultraviolet light source 3. Since the ultraviolet ray generated from the lamp is not monochromatic and its energy distributes over a wide range, there is a possibility that the skeleton bond in the insulating film is broken. In this case, it is desirable to irradiate ultraviolet ray via a filter that cuts high-energy ultraviolet ray breaking the skeleton bond in the insulating film. Note that laser (such as KrF laser, ArF laser and $F_2$ laser), various excimer lamps or the like may be used as long as it matches a range of energy capable of eliminating $CH_n$ groups from Si—$CH_n$ (n=1, 2, 3) bond without affecting the skeleton in the insulating film.

Note that the above-described ultraviolet processing apparatus is an apparatus that performs ultraviolet irradiation processing independently, but a supply source of deposition gas and an introduction port of deposition gas for the chamber may be provided, electrodes opposed to each other (opposing electrodes) may be provided in the chamber, and a high-frequency power source may be connected to the opposing electrodes in order to enable the apparatus to perform deposition by a plasma enhanced CVD method.

This makes it possible for the apparatus to perform deposition and ultraviolet irradiation processing after deposition continuously in a same chamber.

Further, in the case of a plasma enhanced CVD apparatus adopting a multi-chamber system, one chamber is used for ultraviolet processing. Thus, a barrier film or the like can be formed without exposing the substrate 10 to atmosphere after ultraviolet processing. With this, it is possible to prevent the increase of the relative dielectric constant or the deterioration of capability of breakdown voltage due to moisture adsorption or the like.

(Explanation of the Method of Forming the Low Dielectric Constant Insulating Film, Which is the Embodiment of the Present Invention)

Next, description will be performed for the method of forming the low dielectric constant insulating film, which is the embodiment of the present invention.

Firstly, the entire process for forming the low dielectric constant insulating film will be explained.

The substrate is subject thereon to formation of an insulating film, where contains Si—$CH_n$ (n=1, 2, 3) bond to Si—O—Si or another silica skeleton. In this case, there exist the following two methods as the film-forming method.

(a) Using a parallel plate plasma enhanced CVD apparatus, deposition gas containing organic compound having siloxane bond or another organic compound, which has Si—$CH_3$ bond, is introduced between the opposing electrodes. Electric power is applied between the opposing electrodes to generate plasma to cause reaction. Thus a CVD insulating film containing Si—$CH_n$ bond is formed on the substrate.

(b) Organic SOG having Si—$CH_3$ bond and siloxane bond is coated on the substrate by a spin coating method, and then the coated film that has been formed is heated to evaporate solvent. Thus a coated insulating film containing Si—$CH_n$ bond is formed.

Next, ultraviolet ray is irradiated on the formed insulating film in the reduced-pressure atmosphere to break $CH_n$ groups from Si—$CH_n$ bond in the insulating film. In this case, the wavelength of ultraviolet ray is set to 120 nm or more. The wavelength is equivalent to the energy of 10 eV or less, which matches the range of energy capable of eliminating $CH_n$ groups from Si—$CH_n$ bond without affecting the skeleton of Si—O—Si or the like.

Then, the broken $CH_n$ groups are ejected from the insulating film. For example, substrate-heating temperature is set to room temperature to 450° C., preferably to 100° C. to 450° C. As a result, the broken $CH_3$ groups are ejected from the insulating film. Thus, the low dielectric constant insulating film is formed.

Note that the reason why the upper limit of the substrate heating temperature is set to 450° C. is to prevent alteration of material itself or reaction with surrounding matter when copper or aluminum has already been formed. Further, it is because although room temperature or more is acceptable as the lower limit of the heating temperature, $CH_n$ groups can be ejected faster when the heating temperature is set to 100° C. or more In a series of the above-described steps, the step of irradiating ultraviolet ray to break $CH_3$ groups from Si—$CH_3$ bond in the insulating film and the step of ejecting the broken $CH_3$ groups from the insulating film can be performed simultaneously. In this case, ultraviolet ray is irradiated while heating the substrate.

Note that a series of the above-described steps may be repeated to stack the low dielectric constant insulating films of this embodiment in plural layers, and thus a thick low dielectric constant insulating film can be formed as an entire body.

Next, particularly effective combination of a specific deposition material will be cited.
 (i) Deposition gas
 (α) Constitution of deposition gas
  (a) Oxidizing gas/organic compound having siloxane bond and Si—$CH_3$ bond
  (b) Oxidizing gas/organic compound having siloxane bond and Si—$CH_3$ bond/$C_xH_yF_z$
  (c) Oxidizing gas/another organic compound having Si—$CH_3$ bond
  (d) Oxidizing gas/another organic compound having Si—$CH_3$ bond/$C_xH_yF_z$
 (β) Specific examples of the organic compound having siloxane bond and Si—$CH_3$ bond, the oxidizing gas and $C_xH_yF_z$
  (a) Organic compound having siloxane bond and Si—$CH_3$ bond
   Hexamethyldisiloxane (HMDSO: $(CH_3)_3Si$—O—$Si(CH_3)_3$)
   Octamethylcyclotetrasiloxane (OMCTS)

[formula 1]

Octamethyltrisiloxane (OMTS)

[formula 2]

Tetramethylcyclotetrasiloxane (TMCTS)

[formula 3]

(b) Another organic compound having Si—$CH_3$ bond
   Dimethyldimethoxysilane ($Si(CH_3)_2OCH_3)_2$)
   Tetramethylsilane ($Si(CH_3)_4$)
   Trimethylsilane ($SiH(CH_3)_3$)
   Dimethylsilane ($SiH_2(CH_3)_2$)
   Monomethylsilane ($SiH_3(CH_3)$)
  (c) Oxidizing gas
   $H_2O$, $N_2O$, $CH_3OH$, $C_2H_5OH$, $H_2O_2$ or $O_2$
   One of the oxidizing gas or combination of two or more of the oxidizing gas can be used.
  (d) $C_xH_yF_z$ (x is a positive integer, y is 0 or a positive integer, z is 0 or a positive integer, and y and z do not become 0 at the same time.
   $C_3F_8$
   $C_4F_8$
   $CHF_3$
   $C_2H_4$
 (ii) Coating Solution
  (α) Organic SOG having siloxane bond and Si—$CH_3$ bond Alkylsilsesquioxane Polymer (MSQ)

Next, regarding the low dielectric constant insulating film formed by the above-described method of forming low dielectric constant insulating film, explanation will be given for the result of investigation performed for the aspect of changes of pore size in the film before and after the ultraviolet irradiation processing, the state of pore distribution in the film before and after the ultraviolet irradiation processing, the degree of ejection of $CH_3$ groups in the film before and after the ultraviolet irradiation processing, and the aspect of changes of mechanical strength and the relative dielectric constant of the film before and after the ultraviolet irradiation processing.

(1) FIRST EXAMPLE

A sample is obtained as follows. A silicon oxide film is formed on a silicon substrate based on the following film-forming conditions of plasma enhanced CVD, followed by performing the ultraviolet irradiation processing on the following ultraviolet processing conditions. Note that a silicon oxide film is an insulating film containing Si, O, C and H, hereinafter.

(Film-Forming Conditions I)
 (i) Deposition gas conditions
  HMDSO gas flow rate: 50 sccm
  $H_2O$ gas flow rate: 1000 sccm
  $C_4F_8$ gas flow rate: 50 sccm
  Gas pressure: 1.75 Torr
 (ii) Conditions for generating plasma
  High-frequency power (13.56 MHz) PHF: 300 W
  Low-frequency power (380 KHz) PLF: 0 W
 (iii) Substrate heating temperature: 375° C.
 (iv) Deposited silicon oxide film
  Film thickness: 650 nm
(Ultraviolet Processing Conditions)
 (i) Ultraviolet light source: Deuterium lamp
  Ultraviolet ray wavelength: 120 nm to 400 nm
  Power: 30 W
 (ii) Substrate heating: 400° C.
 (iii) Processing time: 30 minutes Next, regarding the low dielectric constant insulating film formed as described above, the investigation is performed for the aspect of changes of the pore size in the film before and after the ultraviolet irradiation processing. The investigation is conducted by measuring the pore size distribution using a positron-annihilation lifetime spectroscopy developed by National Institute of Advanced Industrial Science and Technology (AIST) who is the applicant of the present invention. The positron-annihilation lifetime spectroscopy is a method of measuring the size and the distribution of pores by irradiating positrons on the sample and detecting γ ray generated from the inside of the sample by a scintillator and a photomultiplier.

Figure 2:
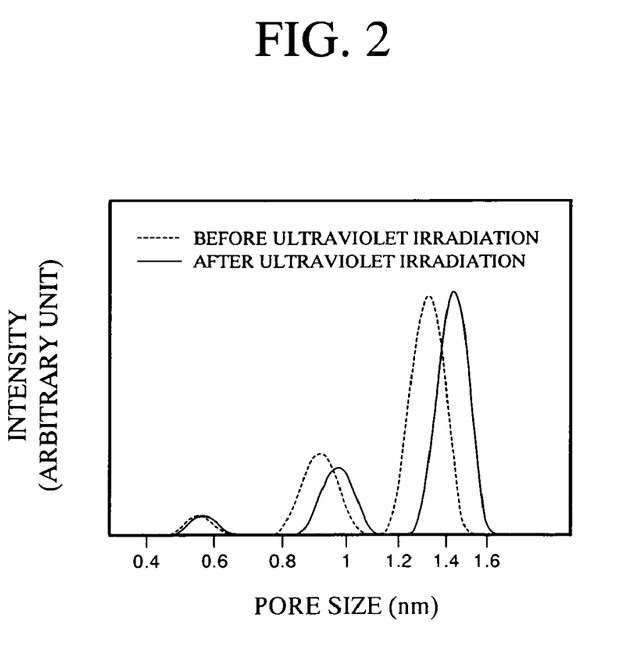
FIG. 2 is a graph showing the changes of a pore size distribution before and after ultraviolet irradiation processing in a plasma CVD insulating film formed by the method of forming the low dielectric constant insulating film, which is a first example of the present invention.

FIG. 2 shows the result. The axis of ordinate in FIG. 2 shows relative strength expressed in linear scale and the axis of abscissa in FIG. 2 shows the pore size distributions (nm). In FIG. 2, the dotted line and the solid line show pore size distributions before and after the ultraviolet irradiation processing, respectively.

According to FIG. 2, the pore size has a wide distribution, and the entire distribution of the pore size shifts toward a larger size by the ultraviolet irradiation. It shows that the pore size becomes larger. The average pore size is 1.22 nm before the ultraviolet irradiation processing and becomes 1.36 nm after the ultraviolet irradiation processing.

Figure 3:
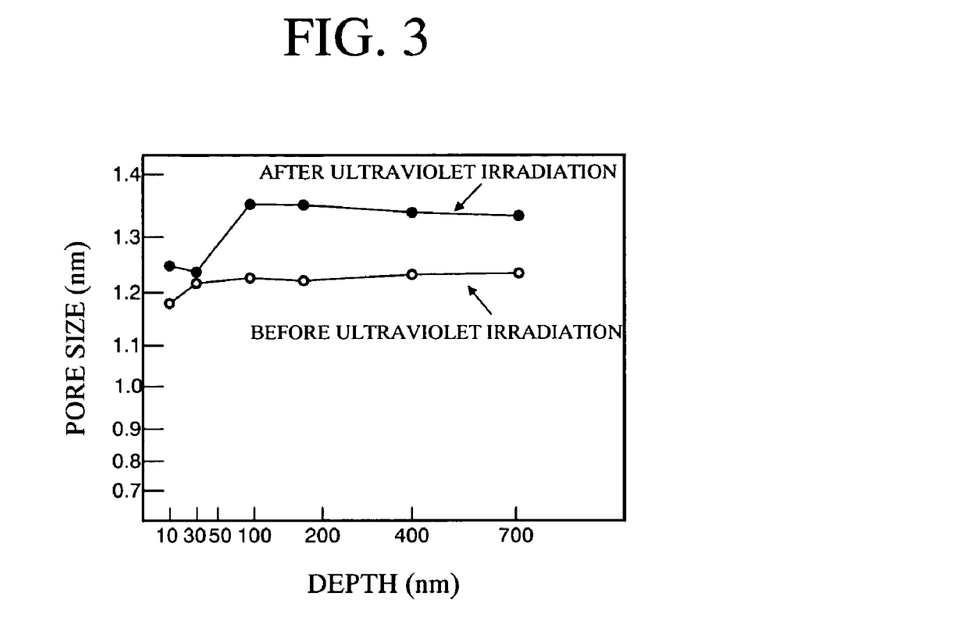
FIG. 3 is a graph showing the status of pore size before and after ultraviolet irradiation processing in the plasma CVD insulating film formed by the method of forming the low dielectric constant insulating film, which is the first example of the present invention.

Next, the investigation is performed for the distribution of the average pore size in a film thickness direction of the formed film before and after the ultraviolet irradiation processing. FIG. 3 shows the result. The axis of ordinate and the axis of abscissa of FIG. 3 respectively show the pore size (nm) and the depth (nm) expressed in logarithmic scale measured from the surface of the formed film. In FIG. 3, the solid line connecting white circles shows the average pore size before the ultraviolet irradiation processing, and the solid line connecting black circles shows the average pore size after the ultraviolet irradiation processing.

According to FIG. 3, it turns out that the changes of the pore size by the ultraviolet irradiation processing occur in the entire film thickness of the formed film.

Figure 4:
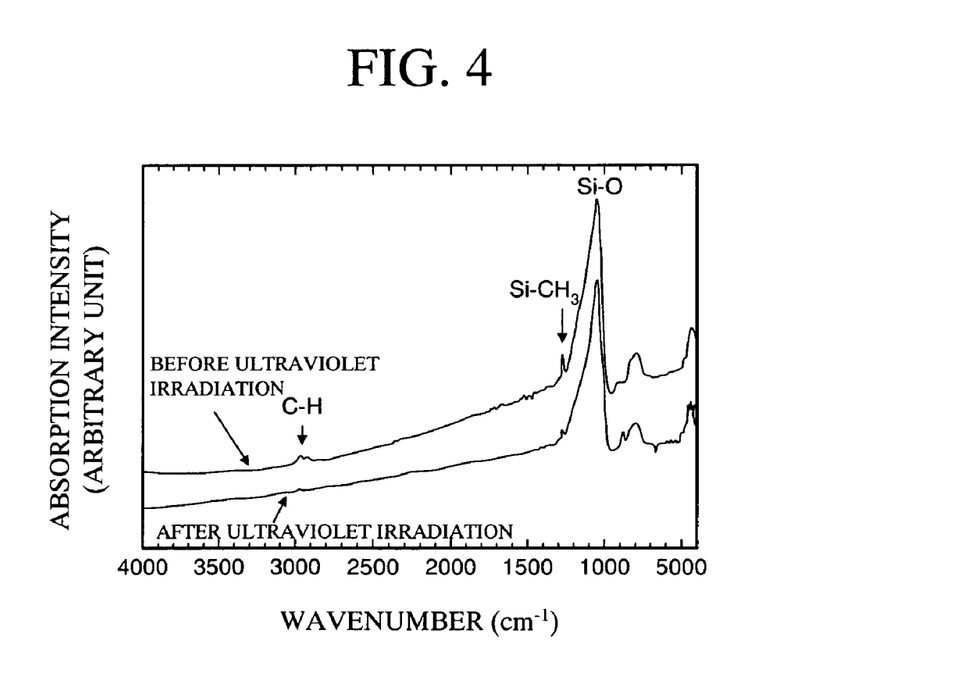
FIG. 4 is a graph showing the degree of ejection of CH$_3$ groups before and after ultraviolet irradiation processing in the plasma CVD insulating film formed by the method of forming the low dielectric constant insulating film, which is the first example of the present invention.

Next, the investigation is performed for the degree of ejection of methyl groups ($CH_3$ groups) from the formed film before and after the ultraviolet irradiation processing. The investigation is conducted by measuring infrared absorption spectrum of the formed film. FIG. 4 shows the result. The axis of ordinate and the axis of abscissa respectively show absorption intensity (arbitrary unit) expressed in linear scale and wavenumber ($cm^{-1}$).

According to the result shown in FIG. 4, the ultraviolet irradiation significantly reduces signal intensity from Si—$CH_3$ bond (wavenumber: 1275 $cm^{-1}$) and C—H bond (wavenumber: 2950 $cm^{-1}$). It is presumed from the result that the expansion of the pore size by the ultraviolet irradiation is caused by elimination of methyl groups in the pore. On the other hand, since the peak shape of Si—O bond distributed in the wavenumber from 1000 $cm^{-1}$ to 1250 $cm^{-1}$ changes little, it is considered that the silica skeleton made up of Si—O—Si bond does not change much.

Note that it is confirmed that no change occurs at all in the pore size distribution and the infrared absorption spectrum when simply the heating processing of 400° C. is performed for the same period of time without applying the ultraviolet irradiation.

Next, the investigation is performed for the mechanical strength (Young's modulus and hardness) of the formed film before and after the ultraviolet irradiation. The investigation is conducted by gradually allowing a probe to penetrate into the inside of the sample from the surface thereof and measuring Young's modulus and the like at an arbitrary depth.

Figure 5:
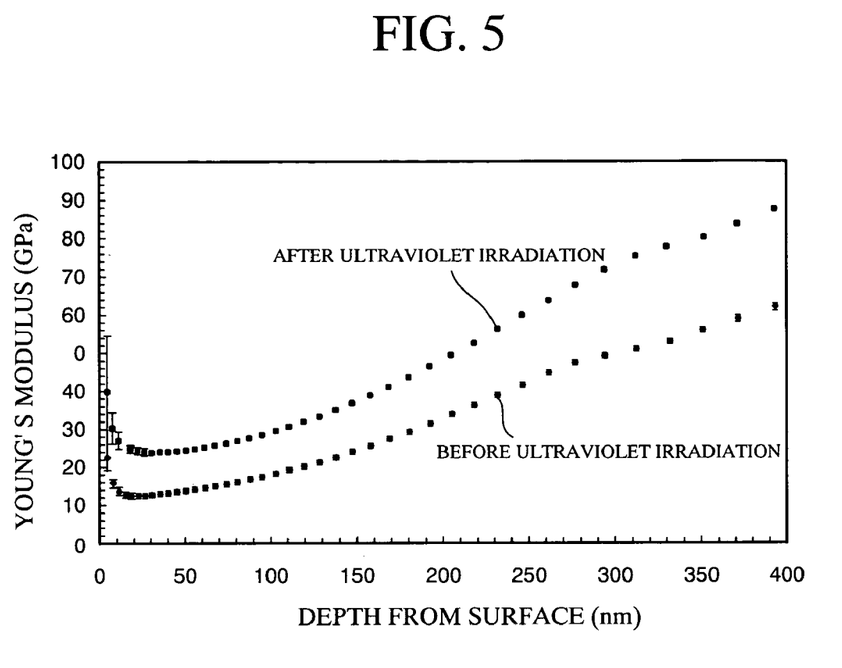
FIG. 5 is a graph showing the mechanical strength (Young's modulus) before and after ultraviolet irradiation processing in the plasma CVD insulating film formed by the method of forming the low dielectric constant insulating film, which is the first example of the present invention.
Figure 6:
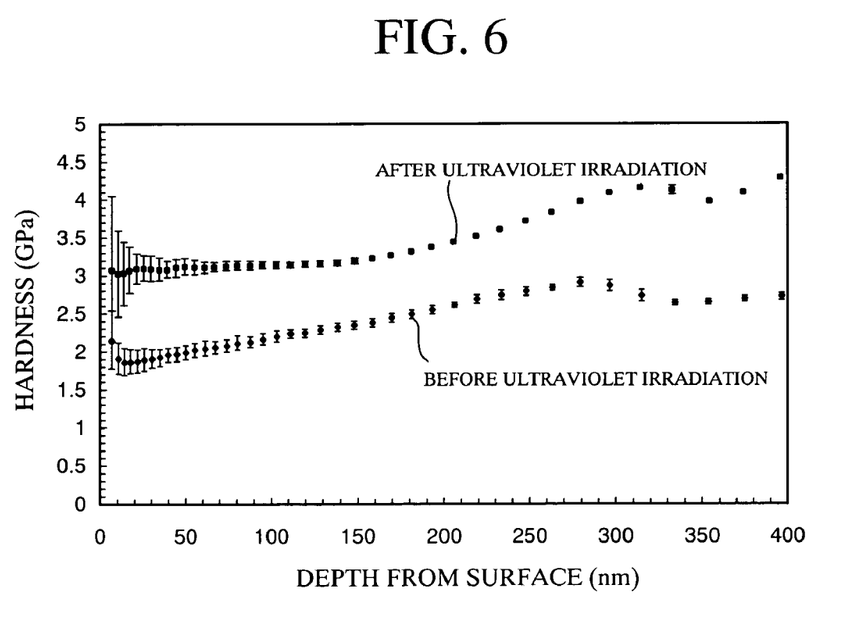
FIG. 6 is a graph showing the mechanical strength (hardness) before and after ultraviolet irradiation processing in the plasma CVD insulating film formed by the method of forming the low dielectric constant insulating film, which is the first example of the present invention.

FIG. 5 and FIG. 6 show the results. The axis of ordinate and the axis of abscissa of FIG. 5 respectively show Young's modulus (GPa) expressed in linear scale and the depth (nm) from the surface expressed in linear scale. The axis of ordinate and the axis of abscissa of FIG. 6 respectively show hardness (GPa) expressed in linear scale and the depth (nm) from the surface expressed in linear scale.

According to the investigation results, when the values at the depth of 30 nm to 40 nm from the surface are regarded as Young's modulus and hardness, Young's modulus of 12.73 GPa and the hardness of 1.87 GPa before the ultraviolet irradiation become Young's modulus of 23.98 GPa and the hardness of 3.01 GPa after the ultraviolet irradiation. The mechanical strength of film is not only maintained but also improved by the ultraviolet irradiation. As the reason, it is considered that methyl groups is eliminated due to the ultraviolet irradiation and broken bonds (dangling bonds) partially combine each other, so that the strength of the skeleton increases.

Next, the investigation is performed for the relative dielectric constant of the film before and after the ultraviolet irradiation processing. The investigation is conducted as follows. That is, applying direct current voltage to a silicon oxide film, capacitance is measured by a C-V measurement method where a signal of 1 MHz is superposed to the direct current voltage, and then the constant is calculated from a capacitance value. According to the investigation result, the relative dielectric constant of 2.74 before the ultraviolet irradiation becomes 2.67 after the ultraviolet irradiation.

As described above, it is possible to maintain or improve the film strength and reduce the relative dielectric constant by the ultraviolet irradiation. Consequently, the method of forming the low dielectric constant insulating film according to the present invention is extremely effective.

Note that the improvement of film strength is recognized. It is presumed to be caused by the recombination of the dangling bonds where methyl groups are eliminated. However, if such recombination reaction occurs too much, shrinkage and high density of the film occur in some cases and thus there is a possibility that the relative dielectric constant increases. Further, since methyl groups have a function to improve moisture resistance, removing all methyl groups is not necessarily good for the low dielectric constant insulating film. Therefore, it is necessary to adjust the degree of the recombination reaction occurrence and the amount of methyl groups to be removed. The adjustment can be performed by adjusting ultraviolet irradiation dose (such as power and irradiation time).

(2) SECOND EXAMPLE

In the second example, a silicon oxide film is formed using deposition gas different from that of the first example, and investigation is conducted as to how the difference of the substrate-heating temperature during the ultraviolet irradiation affects the pore size and the relative dielectric constant. The silicon oxide film as the low dielectric constant insulating film is formed on the silicon substrate in the same manner as the first example, and then the ultraviolet irradiation is performed to the silicon oxide film. A sample is obtained in this manner. The silicon oxide film is formed under the following film-forming conditions by the plasma CVD method.

(Film-Forming Conditions II)
 (i) Deposition conditions
  HMDSO gas flow rate: 50 SCCM
  $H_2O$ gas flow rate: 1000 SCCM
  Gas pressure: 1.75 Torr
 (ii) Conditions for generating plasma
  High-frequency power (13.56 MHz) PHF: 300 W
  Low-frequency power (380 KHz) PLF: 0 W
 (iii) Substrate heating temperature: 375° C.
 (iv) Deposited silicon oxide film Film thickness: 650 nm
(Ultraviolet Processing Conditions)
(i) Ultraviolet light source: Deuterium lamp
Ultraviolet ray wavelength: 120 nm to 400 nm
Power: 30 W
(ii) Substrate heating: 200° C., 400° C.
(iii) Processing time: 20 minutes Regarding the silicon oxide film, the investigation is performed for the changes of the pore size in the film and the relative dielectric constant (k) of the film before and after the ultraviolet irradiation processing.

According to the investigation results, the pore size, which is 0.96 nm before the ultraviolet irradiation, becomes 1.02 nm at the substrate heating temperature of 200° C. and 1.17 nm at 400° C. after the ultraviolet irradiation.

Note that the relative dielectric constant, which is approximately 2.58 before the ultraviolet irradiation, reduces to 2.42 after the ultraviolet irradiation.

From the above-described investigation results, a larger pore size is obtained and a lower relative dielectric constant is expected when the substrate-heating temperature is set to a higher temperature whenever possible within a range where the skeleton of the insulating film is not affected.

(2) THIRD EXAMPLE

In the third example, investigation is conducted particularly as to how the difference of the amount of methyl groups in the film affects the pore size and the relative dielectric constant. For this purpose, using deposition gas different from that of the first and second examples, a silicon oxide film as the low dielectric constant insulating film is formed on the silicon substrate in the same manner as the first example, and thus a sample is obtained. The silicon oxide film is formed by a plasma enhanced CVD method under the following film-forming conditions.

(Film-Forming Conditions III)
   (i) Deposition conditions
   HMDSO gas flow rate: 50 SCCM
   $H_2O$ gas flow rate: 1000 SCCM
   $C_2H_4$ gas flow rate: 50 SCCM
   Gas pressure: 1.75 Torr
   (ii) Conditions for generating plasma
   High-frequency power (13.56 MHz) PHF: 300 W
   Low-frequency power (380 KHz) PLF: 0 W
   (iii) Substrate heating temperature: 400° C.
   (iv) Deposited silicon oxide film
   Film thickness: 650 nm
   (Ultraviolet Processing Conditions)
   (i) Ultraviolet light source: Deuterium lamp
   Ultraviolet ray wavelength: 120 nm to 400 nm
   Power: 30 W
   (ii) Substrate-heating temperature: 400° C.
   (iii) Processing time: 30 minutes Regarding the silicon oxide film, investigation is performed for the changes of the relative dielectric constant (k) of the film before and after the ultraviolet irradiation processing.

According to the investigation results, the relative dielectric constant, which is approximately 2.66 before the ultraviolet irradiation, reduces to 2.45 after the ultraviolet irradiation. As the reason why the reduction ratio of the relative dielectric constant is large in this example, the following is considered. That is, since the source gas contains $C_2H_4$ gas, the concentration of methyl groups in the formed film is high. Thus it results in generation of a larger amount of pores. In other words, as an insulating film has larger content of weak bond groups in the state before the ultraviolet irradiation processing, so the reduction effect of relative dielectric constant is larger therein.

(2) FOURTH EXAMPLE

In the fourth example, investigation is conducted for a silicon oxide film deposited by a spin coating method. Using organic SOG containing siloxane bond and Si—$CH_3$ bond, the silicon oxide film as the low dielectric constant insulating film is formed on the silicon substrate by the spin coating method in the same manner as the first example, and thus a sample is obtained. The silicon oxide film is formed under the following film forming conditions.

Figure 7:
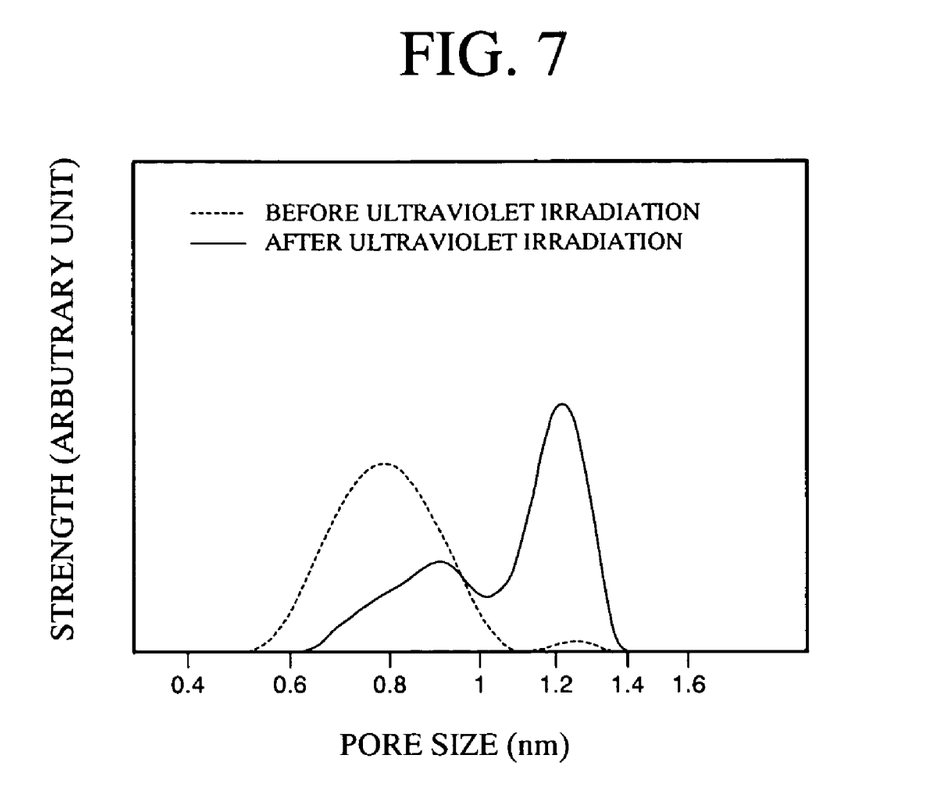
FIG. 7 is a graph showing the changes of the pore size before and after ultraviolet irradiation processing in a coated insulating film formed by the method of forming the low dielectric constant insulating film, which is a fourth example of the present invention.

(Film Forming Conditions IV)
   (i) Coating conditions
   Coating solution: Alkylsilsesquioxane polymer (MSQ)
   Rotation speed: 2000 rpm to 3000 rpm
   (ii) Thermal treatment conditions after coating
   Substrate-heating temperature: 400° C.
   (iii) Coated silicon oxide film
   Film thickness: 400 nm
   (Ultraviolet Processing Conditions)
   (i) Ultraviolet light source: Deuterium lamp
   Ultraviolet ray wavelength: 120 nm to 400 nm
   Power: 30 W
   (ii) Substrate-heating temperature: 400° C.
   (iii) Processing time: 30 minutes Regarding the silicon oxide film, FIG. 7 shows the investigation result of the pore size distribution before and after the ultraviolet irradiation processing. The axis of ordinate of FIG. 7 shows the strength (arbitrary unit) expressed in linear scale and the axis of abscissa of FIG. 7 shows the pore size (nm).

According to FIG. 7, the average pore size, which is 0.81 nm before the ultraviolet irradiation, becomes 1.11 nm after the ultraviolet irradiation. It is confirmed that the pore size becomes larger in the coated silicon oxide film formed by the spin coating method using MSQ as well. The coated silicon oxide film also has a structure where methyl groups are combined with a part of the silica network structure (skeleton) of Si—O—Si. Therefore, it is considered that the methyl groups are eliminated by the ultraviolet irradiation without affecting the skeleton and thus the pore size becomes larger.

As described above, according to the embodiment of the present invention, the insulating film containing Si—$CH_3$ bond, which is the insulating film originally having a solid skeleton called Si—O—Si, is formed by the plasma enhanced CVD method or the spin coating method, and then the insulating film is subject to not oxidation but the ultraviolet irradiation in the reduced-pressure atmosphere to break $CH_3$ groups from Si—$CH_3$ bond in the insulating film, and then they are ejected from the insulating film.

In this case, by setting the energy of the irradiated ultraviolet ray higher than the binding energy of Si—$CH_3$ bond groups and lower than the binding energy of Si—O—Si that forms the skeleton, $CH_3$ groups can be broken from Si—$CH_3$ bond in the insulating film without affecting the skeleton of the insulating film.

This makes it possible to maintain or improve the strength of the insulating film and reduce the dielectric constant of the insulating film.

As described above, the present invention has been explained in detail according to the embodiments, but the scope of the invention is not limited to the examples specifically shown in the above-described embodiments, and modifications of the above-described embodiments without departing from the gist of the invention is included in the range of the present invention.

For example, the film-forming conditions for the insulating film formed first are described in the first to fourth examples, but the conditions are not limited to them. Film-forming conditions such as being capable of forming an insulating film having Si—$CH_n$ (n=1, 2, 3) bond to the skeleton of Si—O—Si are acceptable. It is possible to obtain the effect of this invention with the application of this invention as long as the insulating film is one formed under the condition.

Furthermore, the following film-forming conditions are acceptable. They are those such as being capable of forming an insulating film containing Si—$CH_n$ (n=1, 2, 3) bond in the silica skeleton of Si—O other than Si—O—Si, and the insulating film capable of being transformed into a film having solid mechanical strength by the ultraviolet irradiation in the reduced-pressure atmosphere. For example, it is possible to use another organic compound having Si—$CH_3$ bond, which is dimethyldimethoxysilane ($Si(CH_3)_2OCH_3)_2$), tetramethylsilane ($Si(CH_3)_4$), trimethylsilane bx;1($SiH(CH_3)_3$), dimethylsilane ($SiH_2(CH_3)_2$) or monomethylsilane ($SiH_3(CH_3)$). In this case, the insulating film immediately after deposition has the silica skeleton called Si—O other than Si—O—Si. Although the film strength is not as solid as that of Si—O—Si, the mechanical strength of the film can be improved by the ultraviolet irradiation in the reduced-pressure atmosphere for making porous.

As described above, according to the present invention, an initial film-formation is performed for the insulating film containing Si—$CH_n$ (n=1, 2, 3) bond, which is the insulating film originally having the solid skeleton called Si—O—Si, or the insulating film having the silica skeleton other than Si—O—Si, which is transformed into the insulating film having solid skeleton by the ultraviolet irradiation in the reduced-pressure atmosphere, and then the insulating film is subject to not oxidation but the ultraviolet irradiation in the reduced-pressure atmosphere to break $CH_n$ groups from Si—$CH_n$ bond in the insulating film, and then they are ejected from the insulating film.

In this case, by setting the energy of the irradiated ultraviolet ray higher than the binding energy of Si—$CH_n$ bond groups and lower than the binding energy of Si—O—Si or another Si—O, which forms the skeleton, $CH_n$ groups can be broken from Si—$CH_n$ bond in the insulating film without affecting the skeleton of the insulating film.

This makes it possible to maintain or improve the strength of the insulating film and reduce the dielectric constant of the insulating film.

What is claimed is:

1. A method of forming a low dielectric constant insulating film, comprising the steps of:
   (a) forming a non-porous insulating film consisting essentially of said insulating film containing Si—$CH_n$(n=1, 2, 3) bonds in a Si—O—Si or other Si—O skeleton, on a substrate;
   (b) irradiating said insulating film with ultraviolet light in an atmosphere of reduced-pressure or reduced-pressure and containing mainly inert gas and nitrogen, wherein the ultraviolet light has an energy level higher than the binding energy of the Si—$CH_n$ bonds in said insulating film and lower than the binding energy of the Si—O—Si or other Si—O bonds in the skeleton, and wherein the irradiating is without oxidation, to break the Si—$CH_n$ bonds and free $CH_n$ groups, without affecting the skeleton; and
   (c) removing the free $CH_n$ groups from said insulating film.

2. The method of forming the low dielectric constant insulating film according to claim 1, wherein
   the wavelength of said ultraviolet light is 120 nm or more.

3. The method of forming the low dielectric constant insulating film according to claim 1, wherein
   step (c) is performed after step (b).

4. The method of forming the low dielectric constant insulating film according to claim 1, wherein
   step (b) and step (c) are performed simultaneously by irradiating ultraviolet light on said insulating film in the reduced-pressure atmosphere while heating said substrate.

5. The method of forming the low dielectric constant insulating film according to claim 1, wherein
   the steps (a), (b) and (c) are performed repeatedly.

6. The method of forming the low dielectric constant insulating film according to claim 1, wherein
   step (a) comprises applying electric power to (1) a deposition gas which contains an organic compound having Si—$CH_3$ bonds and siloxane bonds or (2) a deposition gas which contains an organic compound having Si—$CH_3$ bonds and oxidizing gas, to generate a plasma and reaction to form a CVD insulating film containing Si—$CH_n$ bonds on said substrate.

7. The method of forming the low dielectric constant insulating film according to claim 6, wherein:
   the electric power is applied to deposition gas (1); and
   the organic compound having the Si—$CH_3$ bonds and siloxane bonds is any one of hexamethyldisiloxane (HMDSO: $(CH_3)_3Si$—O—$Si(CH_3)_3$),
   octamethylcyclotetrasiloxane (OMCTS),

[formula 4]

octamethyltrisiloxane (OMTS),

[formula 5]

and tetramethylcyclotetraslloxane (TMCTS)

[formula 6]

8. The method of forming the low dielectric constant insulating film according to claim 6, wherein:
the electric power is applied to deposition gas (2); and
another organic compound having the Si—$CH_3$ bonds is any one of
dimethyldimethoxysilane ($Si(CH_3)_2OCH_3)_2$),
tetramethylsilane ($Si(CH_3)_4$),
trimethylsilane ($SiH(CH_3)_3$), and
dimethylsilane ($SiH_2(CH_3)$).

9. The method of forming the low dielectric constant insulating film according to claim 6, wherein:
the electric power is applied to deposition gas (2); and
said oxidizing gas is at least one of $H_2O$, $N_2O$, $CH_3OH$, $C_2H_5OH$, $H_2O_2$ and $O_2$.

10. The method of forming the low dielectric constant insulating film according to claim 6, wherein:
the electric power is applied to deposition gas (2); and
said deposition gas (2) additionally contains $C_xH_yF_z$, wherein x is a positive integer, y is 0 or a positive integer, z is 0 or a positive integer, and y and z are not both 0.

11. The method of forming the low dielectric constant insulating film according to claim 10, wherein said $C_xH_yF_z$ is $C_4F_8$ and $C_2F_4$.

12. The method of forming the low dielectric constant insulating film according to claim 1, wherein
step (a) comprises coating organic SOG, having Si—$CH_3$ bonds and siloxane bonds, as a coating on said substrate.

13. The method of forming the low dielectric constant insulating film according to claim 12, wherein
said organic SOG is alkylsilsesquioxane polymer (MSQ).

* * * * *